(12) United States Patent
Teggatz et al.

(10) Patent No.: US 11,075,628 B2
(45) Date of Patent: *Jul. 27, 2021

(54) POWER SHARING SOLID-STATE RELAY

(71) Applicant: TRIUNE IP, LLC, Plano, TX (US)

(72) Inventors: Ross E. Teggatz, Plano, TX (US); Eric C. Blackall, Plano, TX (US)

(73) Assignee: Triune IP, LLC, Plano, TX (US)

( * ) Notice: Subject to any disclaimer, the term of this patent is extended or adjusted under 35 U.S.C. 154(b) by 88 days.

This patent is subject to a terminal disclaimer.

(21) Appl. No.: 16/272,323

(22) Filed: Feb. 11, 2019

(65) Prior Publication Data

US 2019/0171239 A1    Jun. 6, 2019

Related U.S. Application Data

(63) Continuation of application No. 14/814,368, filed on Jul. 30, 2015, now Pat. No. 10,203,707.

(60) Provisional application No. 62/031,066, filed on Jul. 30, 2014.

(51) Int. Cl.
*H03K 17/687* (2006.01)
*G05F 1/10* (2006.01)
*G05B 19/04* (2006.01)

(52) U.S. Cl.
CPC .......... *H03K 17/6871* (2013.01); *G05F 1/10* (2013.01); *G05B 19/041* (2013.01); *H03K 2217/0009* (2013.01); *H03K 2217/0081* (2013.01)

(58) Field of Classification Search
CPC .. H03K 17/56–735; H02K 2217/0081; H02M 1/096; H02M 2001/0006
See application file for complete search history.

(56) References Cited

U.S. PATENT DOCUMENTS

| 4,649,302 | A |   | 3/1987 | Damiano | H03K 17/6874 323/351 |
| 5,004,969 | A |   | 4/1991 | Schanin | G05F 1/455 323/235 |
| 5,736,795 | A | * | 4/1998 | Zuehlke | H03K 17/6874 307/130 |

(Continued)

FOREIGN PATENT DOCUMENTS

WO        2013095809 A1    6/2013

OTHER PUBLICATIONS

The International Search report and the Written opinion issued by Russian Federal Institute of Industrial Property Office dated Jan. 21, 2016.

(Continued)

*Primary Examiner* — Rexford N Barnie
*Assistant Examiner* — David A Shiao
(74) *Attorney, Agent, or Firm* — Jackson Walker LLP; Christopher J. Rourk

(57) ABSTRACT

A solid-state switch, comprising at least one switch controller. At least one switch having a first terminal coupled to a power source, a second terminal coupled to the power source and a control terminal coupled to the switch controller and configured to selectively conduct and block current flow from the first terminal to the second terminal. At least one power converter coupled to the first terminal and the second terminal and configured to convert power from the power source from a first voltage level to a second voltage level and to provide power at the second voltage level to the switch controller.

19 Claims, 6 Drawing Sheets

(56) References Cited

U.S. PATENT DOCUMENTS

| | | | | |
|---|---|---|---|---|
| 5,872,832 | A | 2/1999 | Bishel | H04M 11/007 340/332 |
| 5,903,139 | A * | 5/1999 | Kompelien | H02M 5/293 323/282 |
| 6,288,458 | B1 * | 9/2001 | Berndt | H02M 3/07 307/130 |
| 6,490,174 | B1 * | 12/2002 | Kompelien | H02M 5/293 323/282 |
| 6,603,221 | B1 | 8/2003 | Liu | H03K 17/725 307/125 |
| 7,009,379 | B2 | 3/2006 | Ramirez | |
| 10,203,707 | B2 | 2/2019 | Teggatz et al. | |
| 2004/0212940 | A1 | 10/2004 | Kugelman | H03K 17/133 361/85 |
| 2007/0114848 | A1 * | 5/2007 | Mulhouse | H02J 7/34 307/43 |
| 2008/0238390 | A1 | 10/2008 | Trivedi et al. | |
| 2010/0026379 | A1 * | 2/2010 | Simard | H02M 7/04 327/540 |
| 2010/0134179 | A1 | 6/2010 | Bayerer | H03K 17/567 327/538 |
| 2010/0265740 | A1 | 10/2010 | Zargari | H02M 1/08 363/17 |
| 2011/0187275 | A1 * | 8/2011 | Giltaca | H05B 47/185 315/159 |
| 2012/0026761 | A1 | 2/2012 | Young | |
| 2012/0161852 | A1 | 6/2012 | Curbelo | H03K 17/0828 327/513 |
| 2013/0033903 | A1 | 2/2013 | Teggatz et al. | |
| 2013/0221117 | A1 * | 8/2013 | Warren | F24D 19/1039 236/1 C |
| 2014/0175181 | A1 | 6/2014 | Warren | G05D 23/19 236/51 |
| 2014/0299670 | A1 * | 10/2014 | Ramachandran | G05D 23/19 236/1 C |
| 2015/0057822 | A1 | 2/2015 | Baldridge | G01R 21/06 700/293 |
| 2016/0006274 | A1 * | 1/2016 | Tu | H02J 7/0063 320/162 |
| 2016/0277071 | A1 | 9/2016 | Dzung | H04B 3/56 |
| 2017/0255212 | A1 | 9/2017 | Teggatz et al. | |

OTHER PUBLICATIONS

The International Preliminary Report on Patentability mailed by the International Bureau of WIPO dated Feb. 9, 2017.

* cited by examiner

POWER SHARING SOLID-STATE RELAY

RELATED APPLICATIONS

This non-provisional application is a continuation of U.S. patent application Ser. No. 14/814,368 filed Jul. 30, 2015, now issued on Feb. 12, 2019 as U.S. Pat. No. 10,203,707, which claims benefit of and priority to U.S. Provisional Application Ser. No. 62/031,066 filed Jul. 30, 2014, each of which are hereby incorporated by reference for all purposes, as if presented herein in their entireties.

TECHNICAL FIELD

The present disclosure relates generally to solid state relays, and more specifically to biasing and redirecting energy in a solid state relay to provide power to other relays, as well as to redirect and balance energy across an isolated or non-isolated secondary region to the primary region.

BACKGROUND OF THE INVENTION

Solid state relays provide a more reliable and faster means to switch loads on and off in a secondary region. When compared to mechanical relays, solid state relays have a much longer cycle life and can turn loads on and off much faster. One of the challenges with solid state relays is that they require a constant charge on the control gate. As such, this constraint requires the control circuit to be constantly operating, which can reduce the battery life when the control circuit is a portable device, as is often the case when a separate power source is not provided for the control circuit.

The prior art solid state relay 100 shown in FIG. 1 uses a capacitor 102 to isolate the solid state switch SW1 and SW2 from the primary side to the secondary side. In 24 VAC systems, the ground line is not available, and only the VAC line (common) and the load lines are available. Because there is no ground line, there is no robust supply path on the secondary side. Therefore, the power to charge the gates of SW1 and SW2 is provided by continuously clocking the isolating capacitor 102 that is tied to solid-state relay 100. This continued clocking consumes continuous power from the primary side. In many cases, the primary side is battery powered, and therefore, the battery power is consumed.

SUMMARY OF THE INVENTION

A solid-state switch is disclosed that includes at least one switch controller and at least one switch having a first terminal coupled to a power source, a second terminal coupled to the power source and a control terminal coupled to the switch controller and configured to selectively conduct and block current flow from the first terminal to the second terminal. At least one power converter is coupled to the first terminal and the second terminal and is configured to convert power that is provided by the power source from a first voltage level to a second voltage level and to provide power at the second voltage level to the switch controller.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
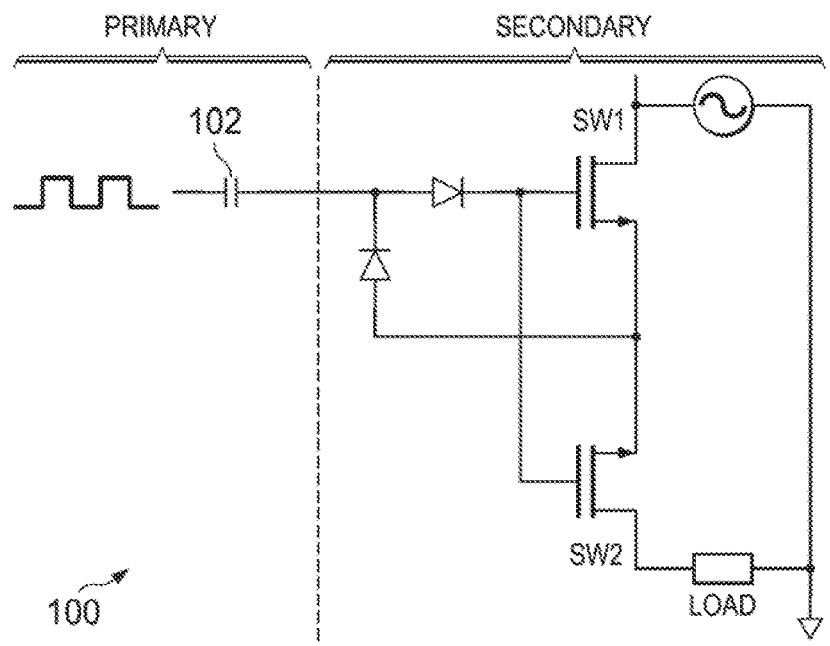
FIG. 1 is a diagram of a prior art relay.

In the description that follows, like parts are marked throughout the specification and drawings with the same reference numerals. The drawing figures might not be to scale and certain components can be shown in generalized or schematic form and identified by commercial designations in the interest of clarity and conciseness.

Referring to FIG. 1, it would be more desirable to be able to latch the solid state relay 100 on and not to continuously provide a clock signal. This configuration would allow the primary side control system to save power.

Solid-state relays can be used for driving 24 VAC systems, including but not limited to HVAC control systems, security systems, smoke detector systems, water sprinkler control systems and pool control systems. These systems can be configured to use isolated and non-isolated power systems. Because there is no supply and ground line located at the secondary side of the solid state relay, energy can be alternatively received by rectifying the energy across the common line and a load line using a diode bridge or other suitable circuits. When a switch is in the off position, the diode bridge can provide energy across the rectifier. A problem with this architecture is that if too much load current is drawn in the off-state switch, the load can inadvertently turn on, because the load current threshold for switching on the load is met. This is undesirable and can cause the system to work in an incorrect manner. Alternatively, energy transfer across a rectifier or other suitable power converter can be limited to occur only when the switch is in the off-state. Therefore, when the switch is in the on-state, energy will not be transferred across the rectifier. The relay of the present disclosure can thus obtain its own power from the secondary circuit power source, to enable more control functionality, such as a latching mode, a switching control, a watchdog heartbeat control, fault reporting, current control and other suitable controls.

The terminology used herein is for the purpose of describing particular examples and is not intended to be limiting of the disclosed subject matter. Like reference numbers refer to like elements throughout the specification. As used herein the term "and/or" includes any combination of one or more of the associated listed items. Also, as used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Also, as used herein, relational terms such as first and second, top and bottom, left and right, and the like may be used to distinguish one entity or action from another entity or action without necessarily requiring or implying any actual such relationship or order between such entities or actions.

Figure 2:
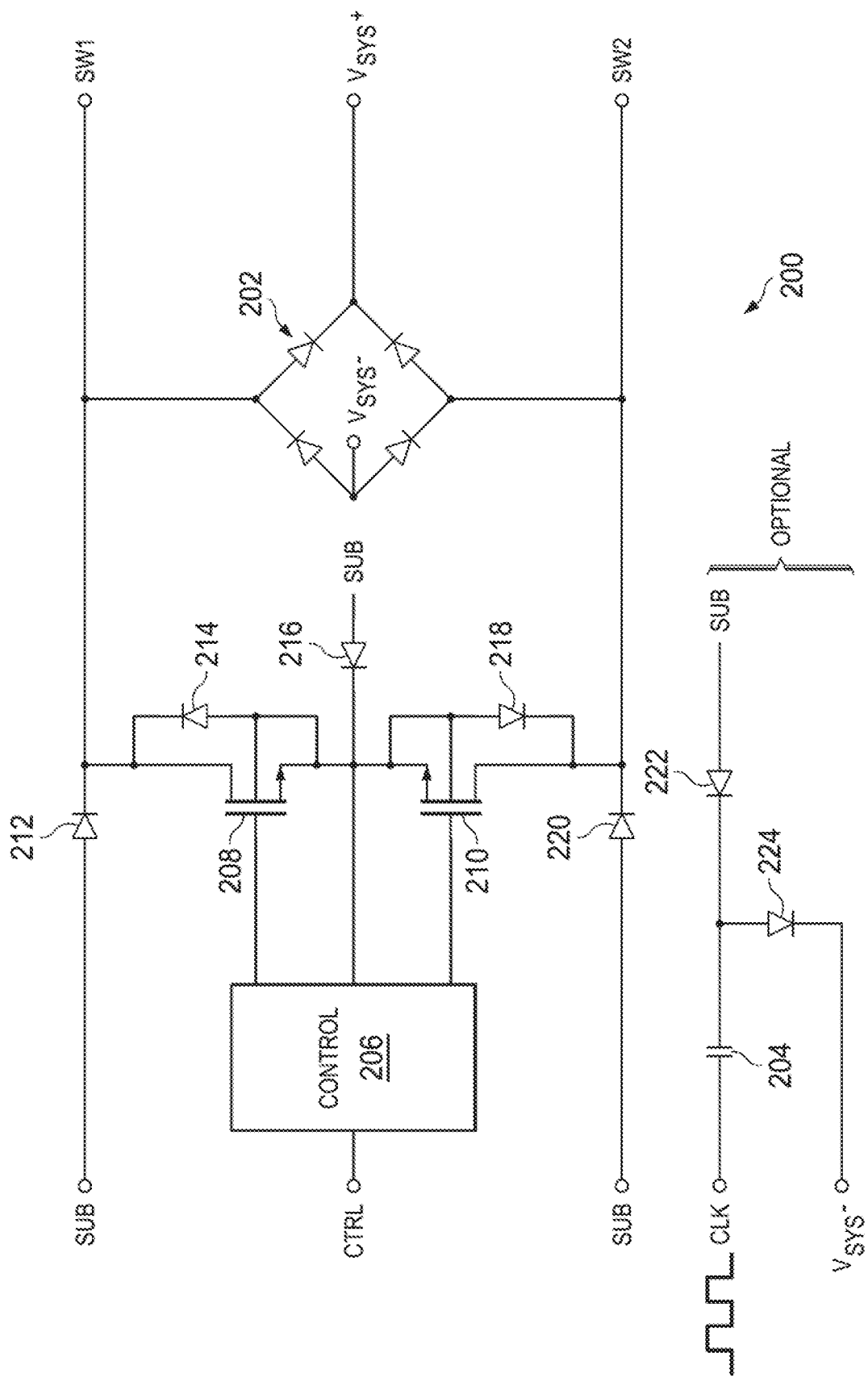
FIG. 2 is a diagram of a circuit in which the system supply energy is provided by a full-bridge diode bridge 202.

FIG. 2 is a diagram of a circuit 200 in which the system supply energy is provided by a full-bridge diode bridge 202, and which provides a voltage bias to the $V_{SYS+}$ and $V_{SYS-}$ pins. In order to better control a solid-state relay switch and to optimize the control of the system, system power can be rectified from the switch terminals SW1 and SW2. Circuit 200 can be implemented in hardware or a suitable combination of hardware and software.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

A storage element, such as capacitor 204, can store energy for use by the system. Alternatively, the $V_{SYS+}$ and $V_{SYS-}$ pins can be tied to other solid-state relays in the system and can share a common energy storage element. The stored energy in this energy storage element can provide power for control 206, which drives the solid state switches 208 and 210 that are placed across switch terminals SW1 and SW2. The substrate (SUB) can be biased below the potential of the source and/or $V_{SYS-}$ pin by using a negative boost circuit (not explicitly shown). This configuration provides additional robustness for the system by minimizing the risk of causing a parasitic bipolar component to turn on, which can cause device failure. Parasitic active devices such as bipolar components are common in solid-state circuits, and although MOS devices are shown in circuit 200, an insulated gate bipolar transistor, bipolar junction transistor or any other suitable low impedance, high voltage device can also or alternatively be used.

Alternatively, power can be provided to a solid-state relay such as system 200 by using active control switches. These active control switches can be used to either limit current or turn power received from the system on or off through the switch terminals.

System 200 further includes diodes 212, 214, 216, 218, 220, 222 and 224, which are used to control current flow in system 200.

Figure 3:
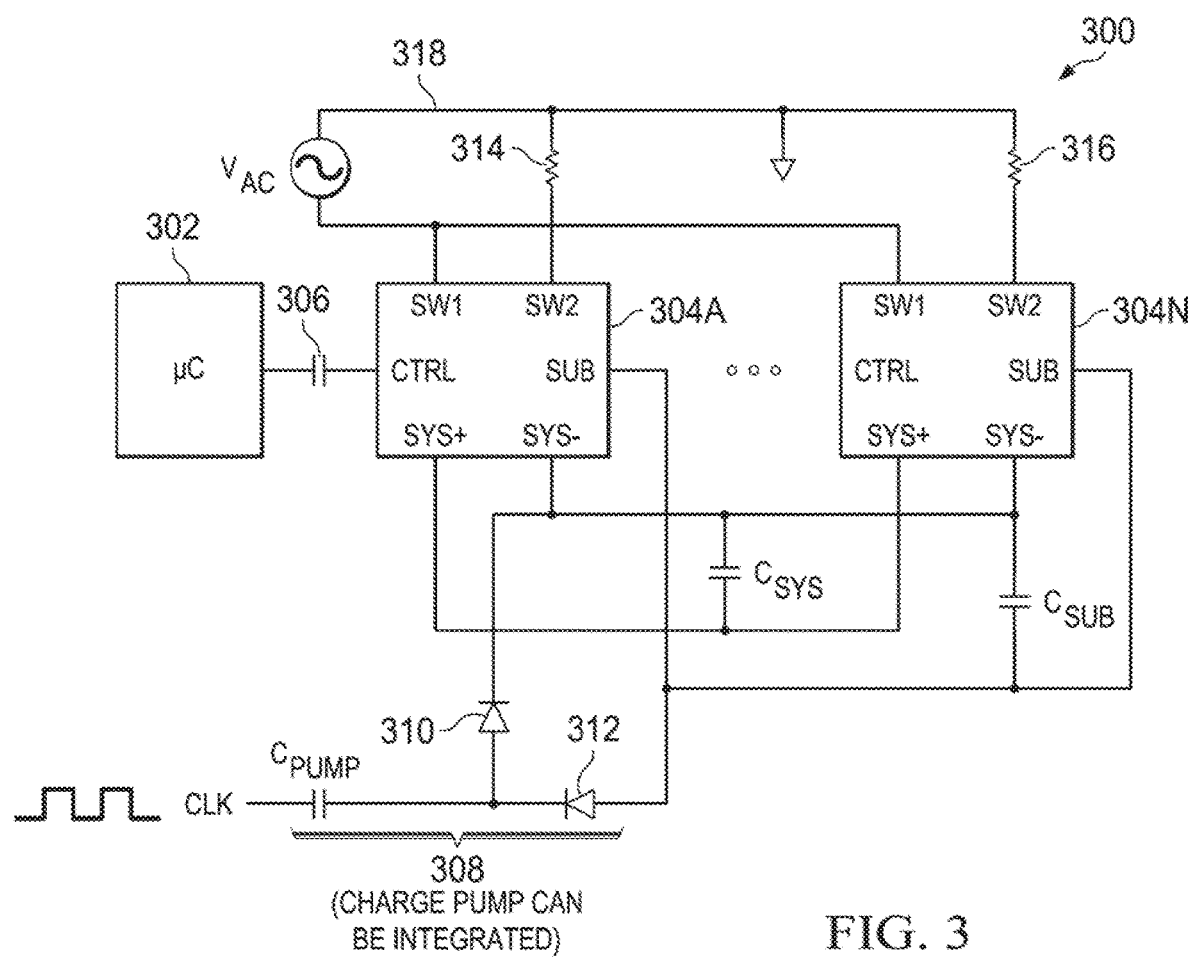
FIG. 3 is a diagram of a circuit for implementing more than one solid-state switch in a system, in accordance with an exemplary embodiment of the present disclosure.

FIG. 3 is a diagram of a circuit 300 for implementing more than one solid-state switch in a system, in accordance with an exemplary embodiment of the present disclosure. Circuit 300 can be implemented in hardware or a suitable combination of hardware and software.

Microcontroller 302 is configured to control relays 304A through 304N, and is isolated by one or more isolation capacitors 306, which can be external isolation capacitors as shown, internal isolation capacitors that are included in relays 304A through 304N, or other suitable isolation capacitors. Each of the control inputs (CTRL) of relays 304A through 304N can have their own dedicated isolation capacitor, can share one common isolation capacitor 306 as shown, or can utilize other suitable configurations. In this configuration, a common $V_{SYS}$ capacitor $C_{SYS}$ is used to store charge that is transferred from a diode bridge or other suitable rectifier of the respective off-state solid-state relays 304A through 304N. Additionally, a negative voltage boost circuit 308 can be used to bias SUB negative with respect to the $V_{SYS-}$ voltage potential. The clock signal for the negative voltage boost can be provided from the primary side clock (CLK) or other suitable sources. Alternatively, the clock signal can be provided from one or more of the solid-state relays. The negative voltage boost circuit 308 is shown as a charge pump circuit having a capacitor $C_{PUMP}$ and diodes 310 and 312, but can also or alternatively use other suitable types of circuits to accomplish the same result, such as a magnetic boost regulator.

A 24 VAC voltage source $V_{AC}$ provides a supply voltage to solid-state relays 304A through 304N, which are used to controllably provide power to load impedances 314 and 316. The current drawn by load impedances 314 and 316 can be monitored over time to detect changes that indicate incipient failure or other fault conditions. In addition, the 24 VAC source can be used to power additional fault detection circuitry, load monitoring and control circuitry or other suitable circuitry (not explicitly shown), where high frequency data communications can also be transmitted over 24 VAC power network 318. In one exemplary embodiment, microcontroller 302 can be configured to read the voltage drop across load impedances 314 and 316, and to track changes in load current over time, such as to detect an incipient failure mode. Likewise, other suitable current sensing mechanisms can also or alternatively be used. In addition, a data communication device located at $V_{AC}$ (not explicitly shown) can be used to communicate with control devices located at load impedances 314 and 316 or in other suitable locations, so as to facilitate communication between devices on 24 $V_{AC}$ power network 318. In this exemplary embodiment, components in an HVAC control system, security system, smoke detector system, water sprinkler control system, pool control system or other suitable systems that utilize 24 VAC power or other suitable power sources can be configured to communicate with each other as well as a system gateway, which can also or alternatively be configured to provide Internet of Things (IOT) connectivity with an external network such as the Internet or other suitable networks.

Figure 4:
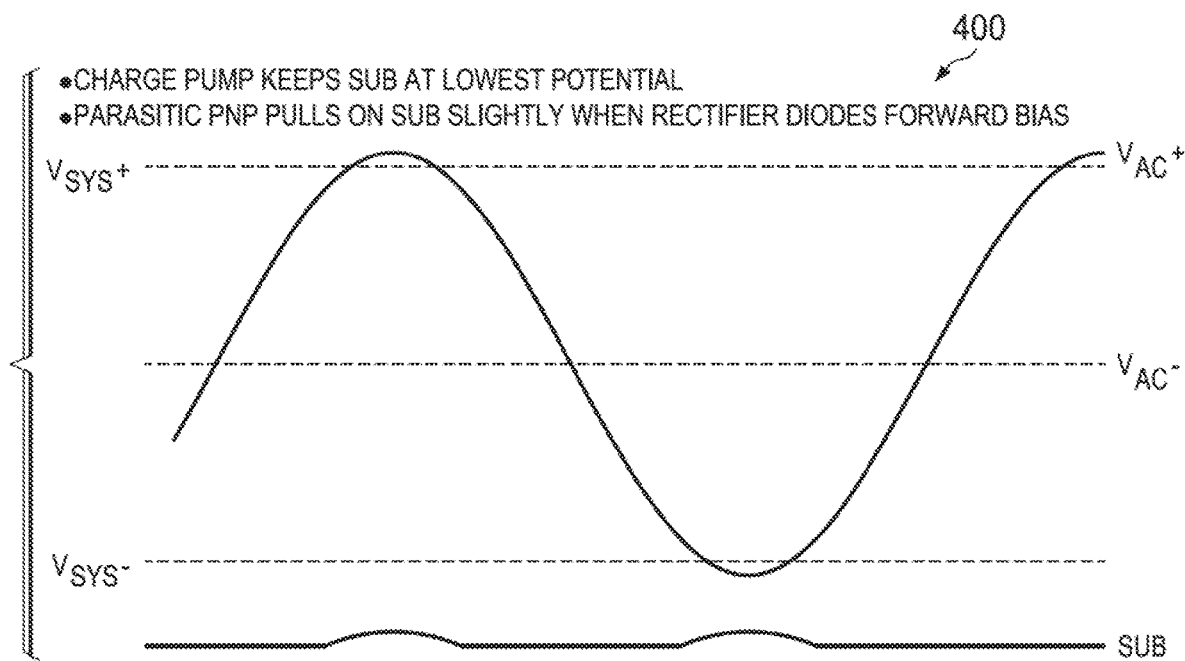
FIG. 4 is a diagram of a waveform of a differential voltage of the disclosed system, in accordance with an exemplary embodiment of the present disclosure.

FIG. 4 is a diagram of a waveform 400 of the $V_{SYS+}$ and $V_{SYS-}$ differential voltage of system 300, in accordance with an exemplary embodiment of the present disclosure. Waveform 400 shows that the negative boost allows the substrate to be at a lower voltage bias than the $V_{SYS-}$ pin. This voltage bias assures that the parasitic NPN within the solid-state circuit will not turn on, which either could cause the device to operate improperly or even cause destruction of the device. During the positive cycle of the 24 VAC voltage waveform, the parasite PNP can turn on, which can cause the bias voltage of the substrate to rise. To minimize this rise, a larger $C_{SUB}$ capacitor can be used to minimize this effect. Alternatively a positive boost circuit can be used to cause the $V_{SYS+}$ pin to be at a voltage potential that is always larger than the 24 VAC signal. This differential voltage can be used to prevent the parasitic PNP from inadvertently turning on.

Figure 5:
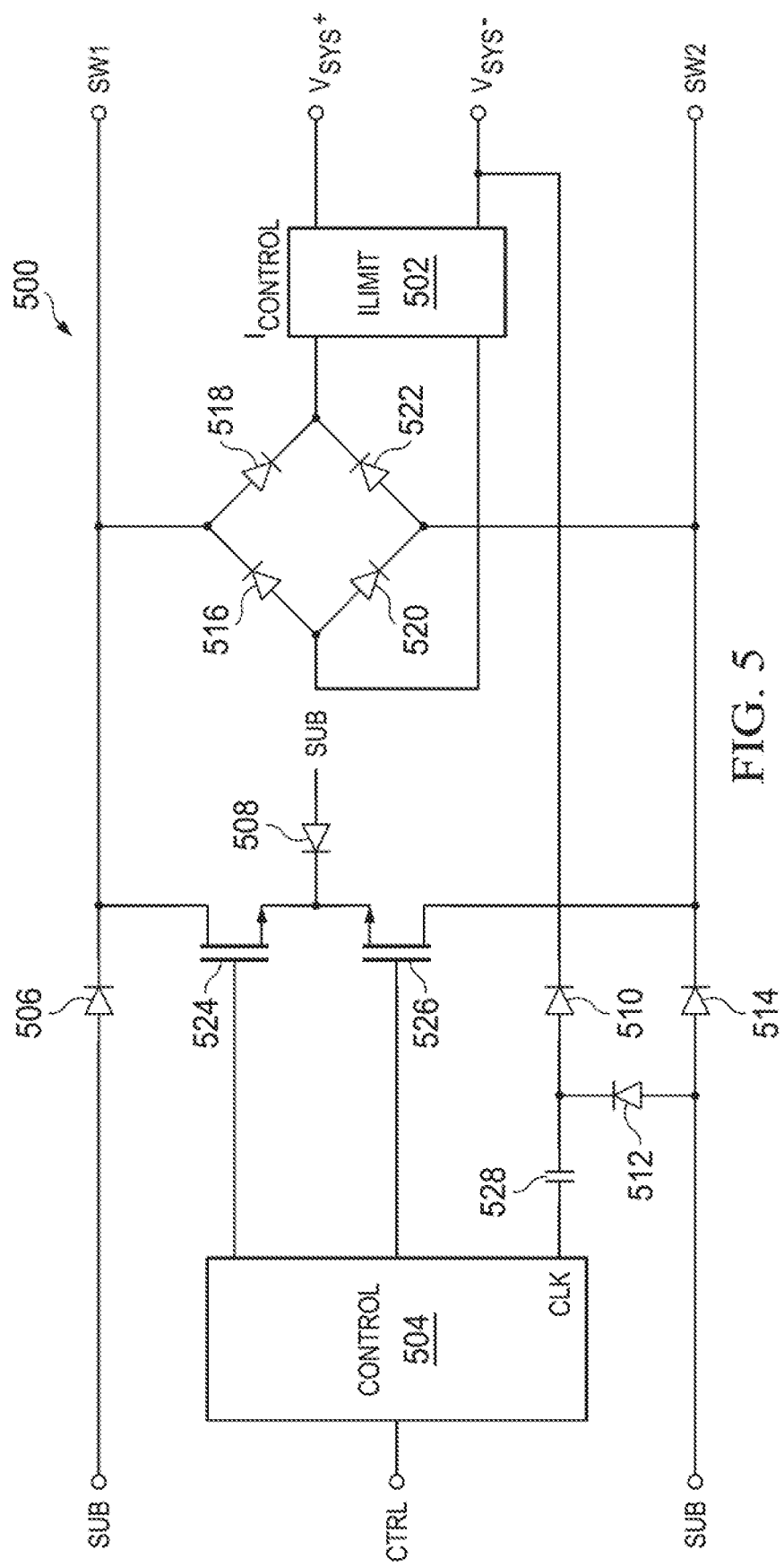
FIG. 5 is a diagram of a system for providing power sharing in a multiple relay system, in accordance with an exemplary embodiment of the present disclosure.

FIG. 5 is a diagram of a system 500 for providing power sharing in a multiple relay system, in accordance with an exemplary embodiment of the present disclosure. System 500 can be implemented in hardware or a suitable combination of hardware and software.

In this exemplary embodiment, a current limit and/or control device ILIMIT 502 can be used to control the amount of power that is received from the switch terminals SW1 and SW2. $I_{CONTROL}$, is driven by control 504, which can receive control data CTRL from a primary side controller. By using current control, the leakage current across the switch pins SW1 and SW2 can be controlled and minimized to assure that the leakage current will not provide enough parasitic current through the system load to inadvertently turn on the system load that is being controlled by a specific solid-state switch. System 500 further includes diodes 506, 508, 510, 512, 514, rectifier bridge diodes 516, 518, 520 and 522, switches 524 and 526 and capacitor 528.

In addition to controlling the current, the voltage at the outputs of the $V_{SYS}$ pins can also be regulated. Voltage regulation can be controlled by switching regulators that use switched capacitor, switched magnetics, a combination of both or other suitable functionality. Alternatively, regulated output can also be controlled by a linear switching control that only operates in a low impedance state and that provides power when the 24 VAC voltage waveform is near the desired voltage output.

Figure 6:
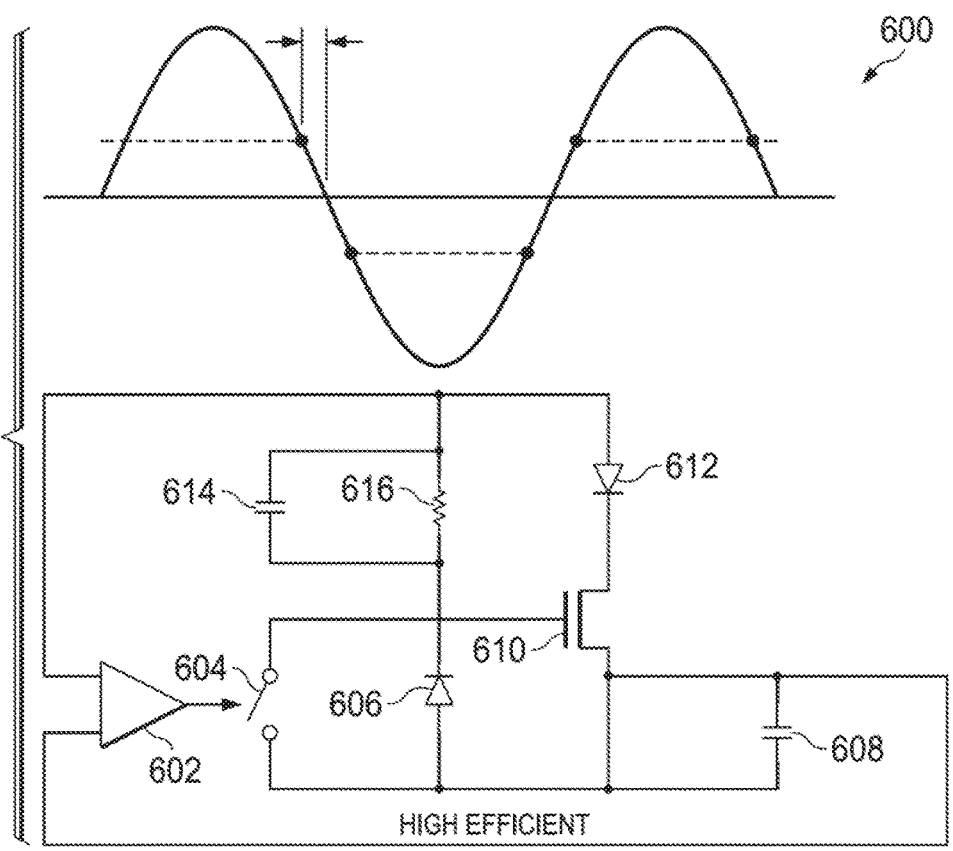
FIG. 6 is a diagram of a switching regulator that is configured to turn a switch on once the voltage across the input terminals of comparator reaches near the target reference voltage, and to turn off when the voltage when it exceeds the comparator voltage.

FIG. 6 shows an example of a switching regulator 600 that is configured to turn switch 604 on once the voltage across the input terminals of comparator 602 reaches near the target reference voltage, and to turn off when the voltage exceeds the comparator voltage. For example, when an inductive load is being powered, operation of switch 604 at a point in time where the voltage waveform is not at a minimum can result in current transients with a relatively high peak current magnitude, due to the discharge of stored energy in the inductive load. By preventing operation of switch 604 at such voltages, switching regulator 600 helps to improve system operation and avoids potential damage and wear to the system from large current transients.

Switching regulator 600 can also minimize power dissipation by only charging the output regulator when the voltage drop is minimal, thereby maximizing efficiency. Circuit 600 further includes diode 606, capacitor 608, transistor 610, diode 612, capacitor 614 and resistor 616. Energy is stored in capacitor 608 when transistor 610 is off, to provide an efficient system where transistor 610 only needs to turn on when the conditions allow for minimal power loss. Diode 612 prevents unwanted current flow from the output or discharging of capacitor 608. Capacitor 614 and resistor 616 control the transients seen at the input.

Figure 7:
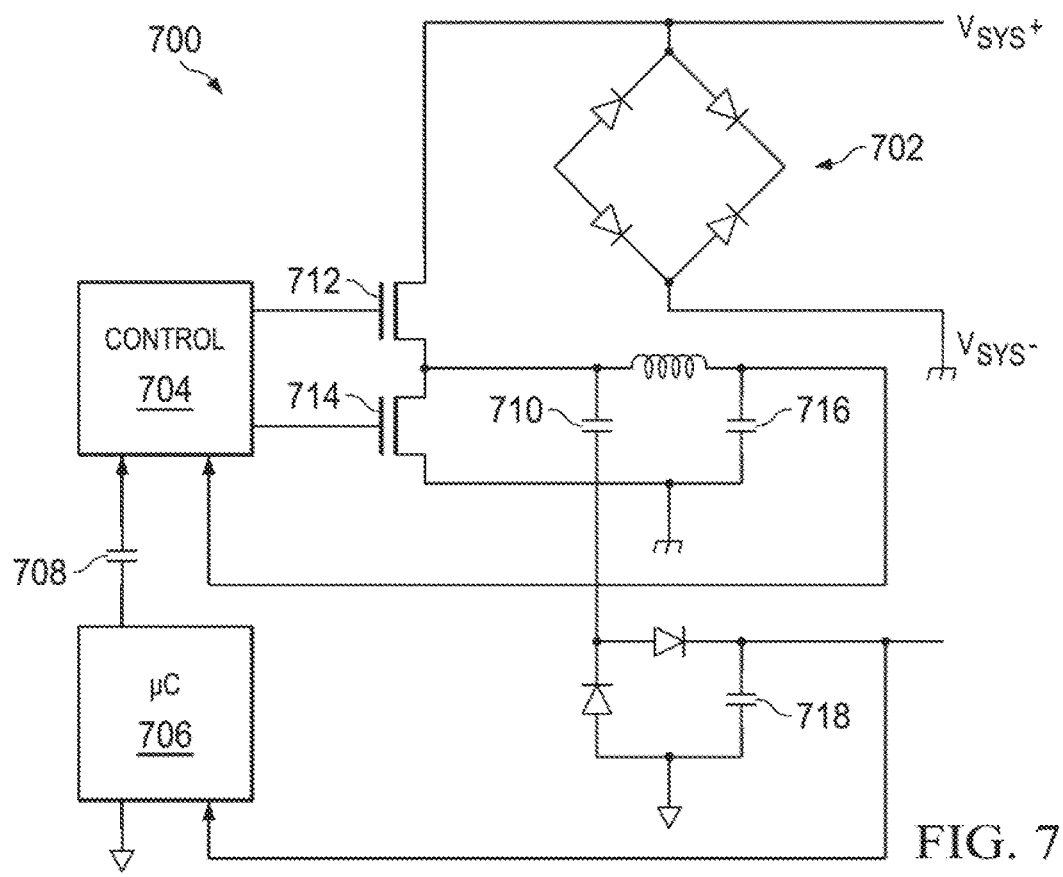
FIG. 7 is a diagram of a switching regulator that is configured to step a voltage down from a bridge rectifier, which is internal to a solid state relay.

FIG. 7 is a diagram of a switching regulator 700 that is configured to step a voltage down from a bridge rectifier 702, which is internal to a solid state relay. Switching regulator 700 can be implemented in hardware or a suitable combination of hardware and software.

The voltage output from the bridge rectifier 702 is $V_{SYS+}$ and $V_{SYS-}$, which is then used to control the power to one or more other solid state relays. The switching pin can alternatively be used to toggle voltage across a capacitor and then the energy across this capacitor can be transferred to the primary side and be stored and used to power the primary controller system. Alternatively, magnetic coupling can be used to transfer energy from the secondary side to the primary side as well.

Switches 712 and 714 can either be integrated inside of the solid state switch or implemented as discrete devices. Switching regulator control 704 can be modified by control device 706 based on the voltage observed on the primary side. Alternatively, power transfer circuitry can be added to provide either isolated or non-isolated regulated power to both the solid-state control device as well as power to the primary side.

Solid-state control device 706 can transmit control data and receive data feedback through a capacitor interface to each of the switches, such as through capacitors 710, 716 and 718. Alternatively a single capacitor interface can be used to transfer control information and data information back to the primary controller. Data transfer protocols such as serial interface bus, LVDS, I2C, CAN, LIN, UART or other suitable single or multi-wire protocols can be used to transfer data. This data can be used to control regulation, the solid state switch or other functions inside 704.

Figure 8:
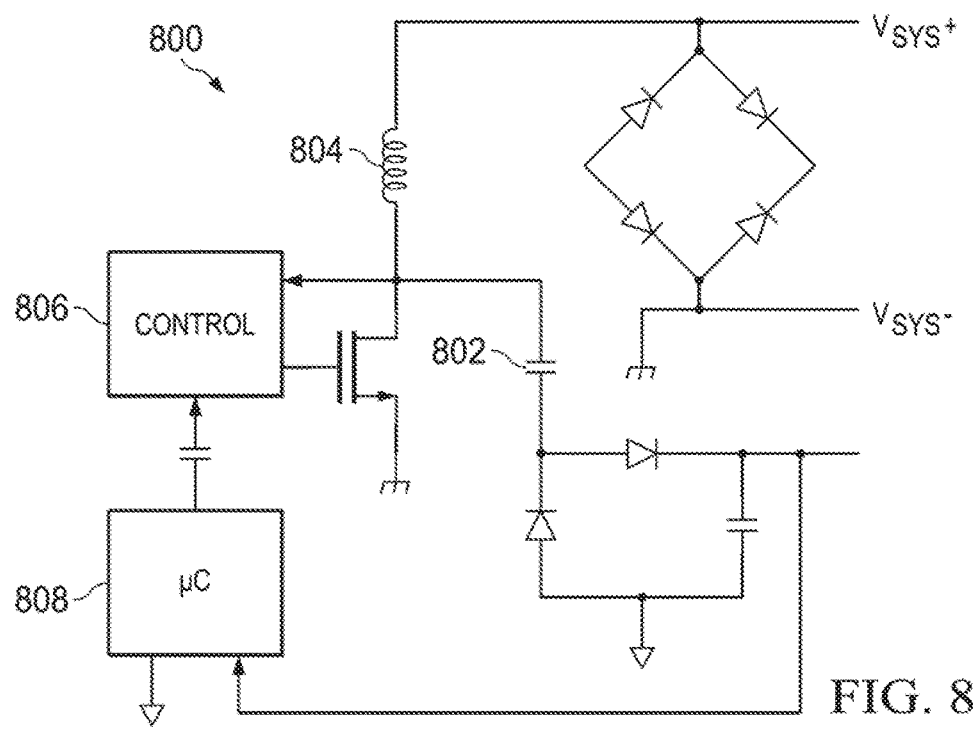
FIG. 8 is a diagram of circuit where the secondary side can transfer energy to the primary side by use of a boost converter that then transfers the energy across capacitor to the primary side.

FIG. 8 is a diagram of circuit 800, where the secondary side can transfer energy to the primary side by use of a boost converter that then transfers the energy across capacitor 802 to the primary side. Circuit 800 can be implemented in hardware or a suitable combination of hardware and software. Alternatively a magnetically coupled interface can be used to transfer energy from the secondary side to the primary side. Alternatively, inductor 804 can be replaced with a FET, resistor or another suitable device to pull up to Vsys+.

Microcontroller 808 can send data to control device 806 to modify frequency or pulse width, so as to control the voltage seen at the primary side. Data transfer protocols such as serial interface bus, LVDS, I2C, CAN, LIN, UART or other suitable single or multi-wire protocols can be used to transfer data. This same data path can be used to control the state or function of the solid state switch.

Figure 9:
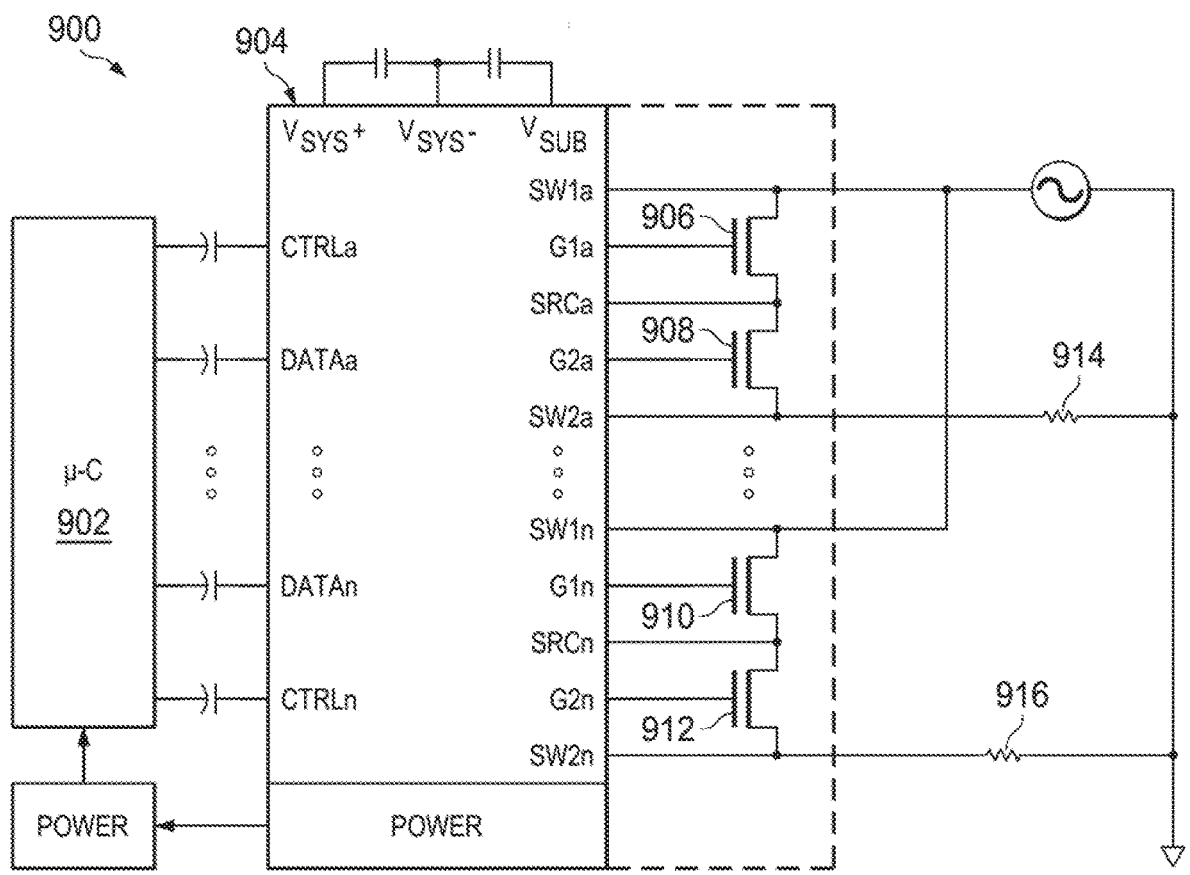
FIG. 9 is a diagram of a system that provides additional control functionality within the solid-state relay.

FIG. 9 is a diagram of a system 900 that provides additional control functionality within the solid-state relay. System 900 can be implemented in hardware or a suitable combination of hardware and software.

System 900 includes microcontroller 902, which is coupled to integrated controller 904. Integrated controller 904 controls the operation of switches 906, 908, 910 and 912, can measure load currents through impedances 914 and 916, can measure load voltages, can store data and programming in a local memory device, can execute stored control algorithms, can download updated control algorithms, can generate status messages and alerts, and can perform other suitable functions.

The added control functionality and memory can be used to monitor the 24 VAC load, such as to detect low voltage conditions, overvoltage conditions, intermittent voltage failure conditions or other suitable conditions. The additional control functionality provides for management of load profiles of the system loads, which can be placed into a look-up table and compared. Both voltage and current profiles can be evaluated during switching, so as to allow for changes from the load to be monitored and evaluated. The solid-state system can determine whether the load is in an on or off state, and can take corrective actions to modify the switch settings for switches 906, 908, 910 and 912, such as by using pulse width modulation, by changing the switch impedance or in other suitable manners. Additionally, high frequency data communications can be modulated onto the 24 VAC line from the control device, such as by modulating a waveform pattern on top of the 24 VAC line and load, by pulse width modulating the switch to the load or in other suitable manners. The respective loads can then receive information that can be used at the end system, such as for control and operation of a compressor, a heater unit, a camera, a microphone, a water sprinkler head, a damper, a servomotor, or other suitable devices. Data communication from the end device can use load dithering that can be evaluated by the solid-state system or other suitable signal processing techniques.

The solid state relay can also or alternatively be used to drive DC voltages, such as those that are used in automatic test equipment or other equipment and systems that require the use of isolated relays. Alternatively, the isolated switch can be used to control one or more switches in a power management system where switching regulation is required but isolation is necessary to control the switch.

Figure 10:
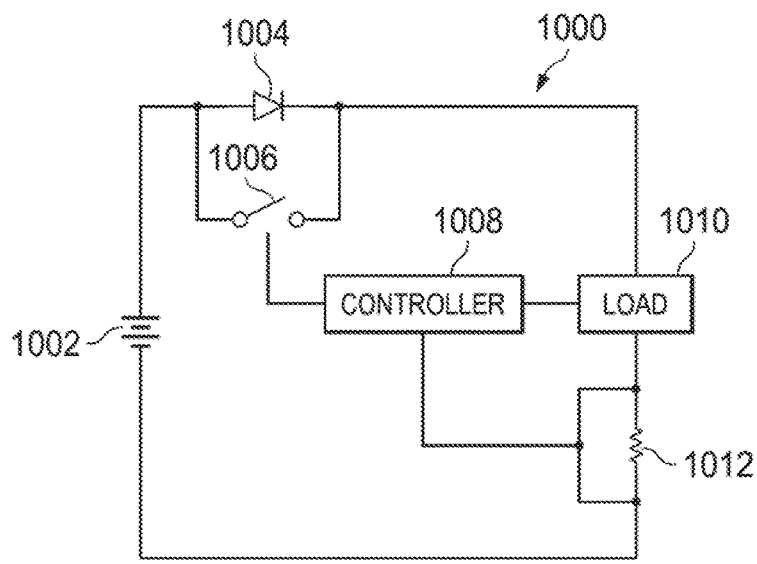
FIG. 10 is a diagram of an automotive control circuit in accordance with an exemplary embodiment of the present disclosure.

FIG. 10 is a diagram of an automotive control circuit 1000 in accordance with an exemplary embodiment of the present disclosure. Automotive control circuit 1000 can be implemented in hardware or a suitable combination of hardware and software.

Automotive control circuit 1000 includes high power switch 1006 and high power diode 1004, which are coupled to battery 1002 and load 1010. Controller 1008 is coupled to high power switch 1006, load 1010 and load current sensor 1012. In operation, load 1010 can draw current from battery 1002, such as a starter motor, a compressor, an electric motive device, or other suitable load devices. During normal operation, high power switch 1006 is closed and conducts current from battery 1002 to load 1010. However, when controller 1008 detects a fault condition, it generates control data to open switch 1006, so as to prevent damaging reverse current flow in the event that the operator of an automobile associated with automotive control circuit 1000 inadvertently connects a replacement battery or supplemental battery to battery 1002 in a reverse polarity, as such reverse polarity connections can result in damaging current flow in the opposite direction of a design current flow direction. In this configuration, diode 1004 blocks the reverse current until the fault condition is corrected, at which point controller 1008 closes switch 1006 to bypass diode 1004. In this manner, high magnitude current does not flow through diode 1004 under normal operation, as that can cause heating damage to occur to diode 1004, which can ultimately result in failure of diode 1004. Nevertheless, diode 1004 is used to prevent damage resulting from inadvertent imposition of reverse polarity on automotive control circuit 1000.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A circuit, comprising:
   at least one solid-state switch;
   at least one power converter coupled across a first terminal and a second terminal of the at least one solid-state switch and configured to convert power from a power source coupled to the at least one solid-state switch from a first voltage level to a second voltage level and to provide the converted power at the second voltage level to at least one component including a switch controller for driving the at least one solid-state switch;
   a current controller coupled to an output of the power converter and configured to limit an amount of current supplied from the first terminal and the second terminal of the at least one solid state switch to the at least one component based on a control signal from the at least one component; and
   one or more additional solid-state switches each comprising respective switch controllers for driving the one or more additional solid-state switches, the respective switch controllers each coupled to receive the converted power from the at least one power converter.

2. The circuit of claim 1 wherein the first terminal of the at least one solid-state switch is coupled to the power source.

3. The circuit of claim 1 wherein the second terminal of the at least one solid-state switch is coupled to the power source.

4. The circuit of claim 1 wherein a control terminal of the at least one solid-state switch is coupled to the at least one component through an isolation capacitor.

5. The circuit of claim 1 wherein each of the at least one solid-state switch and the one or more additional solid-state switches are coupled to a programmable controller through respective isolation capacitors, the circuit further comprising a negative boost circuit including a clocked charge pump coupled to the at least one solid-state switch and the one or more additional solid-state switches.

6. The circuit of claim 1 wherein the power converter comprises a diode bridge rectifier and the at least one component comprises an integrated controller.

7. The circuit of claim 1 further comprising a programmable controller coupled to the at least one component through an isolation capacitor and configured to activate and deactivate the at least one component.

8. The circuit of claim 1 wherein the at least one component comprises an integrated controller configured to measure two or more load currents.

9. The circuit of claim 1 further comprising a voltage controller coupled to the power converter and configured to control a terminal voltage of the power converter.

10. The circuit of claim 1 further comprising a load current monitor configured to store load current data and to detect changes in load current over time.

11. The circuit of claim 1 further comprising a load voltage monitor configured to store load voltage data and to detect changes in load voltage over time.

12. The circuit of claim 1 further comprising a modulator coupled to the power source and configured to modulate a first data signal onto a power conductor and to demodulate a second signal from the power conductor.

13. The circuit of claim 1 further comprising a programmable controller coupled to the at least one component and configured to transmit control data to the at least one component through an isolating capacitor.

14. The circuit of claim 1 wherein the at least one component comprises an integrated controller having a memory and configured to measure one or more load current, to store data in the memory in response to the measured load current and to manage one or more load profile using a look-up table in response to the measured load current.

15. The circuit of claim 1 further comprising a voltage controller coupled to the power converter.

16. The circuit of claim 1 further comprising a load current monitor configured to store load current data and a controller configured to detect fault conditions as a function of the stored load current.

17. The circuit of claim 1 wherein the at least one component comprises an integrated controller.

18. The circuit of claim 1 further comprising a load voltage monitor of the at least one component that is configured to store load voltage data.

19. The circuit of claim 1 further comprising a load voltage monitor of the at least one component that is configured to detect changes in load voltage over time.

* * * * *